(12) United States Patent
Dadafshar

(10) Patent No.: US 6,420,953 B1
(45) Date of Patent: Jul. 16, 2002

(54) MULTI-LAYER, MULTI-FUNCTIONING PRINTED CIRCUIT BOARD

(75) Inventor: Majid Dadafshar, Escondido, CA (US)

(73) Assignee: Pulse Engineering. Inc., San Diego, CA (US)

( * ) Notice: Subject to any disclaimer, the term of this patent is extended or adjusted under 35 U.S.C. 154(b) by 0 days.

(21) Appl. No.: 09/735,108

(22) Filed: Dec. 11, 2000

Related U.S. Application Data

(60) Provisional application No. 60/205,852, filed on May 19, 2000.

(51) Int. Cl.⁷ .................................. H01F 5/00
(52) U.S. Cl. .................. 336/200; 336/232; 336/223
(58) Field of Search ................. 336/200, 223, 336/232

(56) References Cited

U.S. PATENT DOCUMENTS

| 3,657,494 A | 4/1972 | Gargini |
| 3,765,082 A | 10/1973 | Zyetz |
| 5,020,377 A | 6/1991 | Park |
| 5,179,365 A | 1/1993 | Raggi |
| 5,251,108 A | 10/1993 | Doshita |
| 5,521,573 A | 5/1996 | Inoh et al. |
| 5,552,756 A | 9/1996 | Ushiro |
| 5,724,016 A | 3/1998 | Roessler et al. |
| 5,777,539 A | 7/1998 | Folker et al. |
| 5,781,093 A | 7/1998 | Grandmont et al. |
| 5,880,662 A | 3/1999 | Person et al. |

FOREIGN PATENT DOCUMENTS

| EP | 0 961 303 A2 | 11/1988 |
| EP | 90312879.1 | 11/1990 |
| EP | 0 961 303 A | 12/1999 |

Primary Examiner—Anh Mai
(74) Attorney, Agent, or Firm—Knobbe Martens Olson & Bear LLP

(57) ABSTRACT

A multi-layer and multi-functioning printed circuit board (PCB) defines a magnetic component formed using planar technology and multiple PCBs, each having four or six layers and each including a single winding. One set of windings is configured as an inductor and a second set of windings is configured as a transformer. The PCBs are stacked in an offset arrangement such that pins connecting one set of windings on a PCB or PCBs to a main circuit board do not penetrate the PCB or PCBs including another set of windings. The invention is configured to function both as an inductor and a transformer.

29 Claims, 14 Drawing Sheets

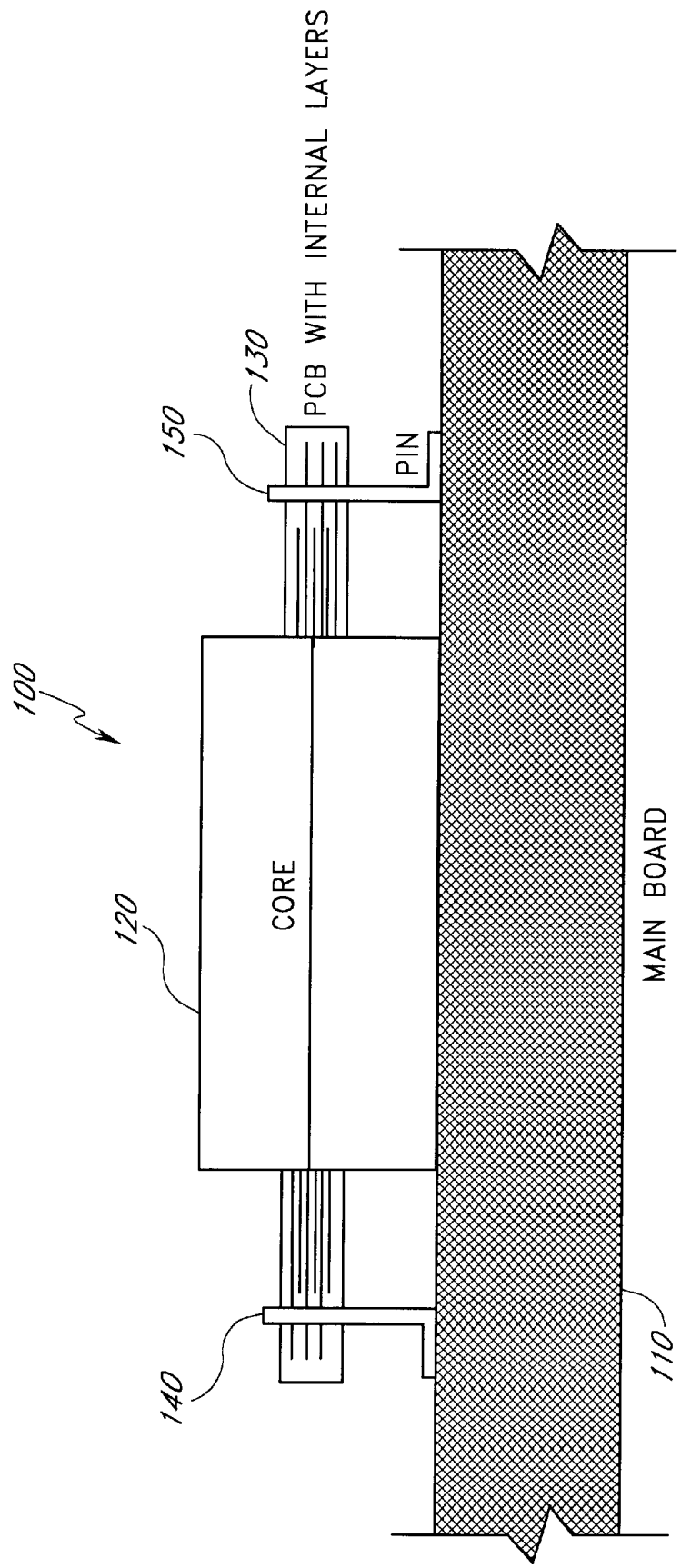

MULTI-LAYER, MULTI-FUNCTIONING PRINTED CIRCUIT BOARD

The benefit under 35 U.S.C. §119(e) of the following U.S. provisional application entitled MULTI-LAYER MICRO-PRINTED CIRCUIT BOARD (PCB) WITH INTEGRATED MAGNETIC COMPONENTS, Ser. No. 60/205,852, filed May 19, 2000, is hereby claimed.

FIELD OF THE INVENTION

The invention relates generally to miniature printed circuit boards (PCB) for microelectrical applications. More particularly, the invention relates to multi-layer and stackable miniature printed circuit boards for static electromagnetic components such as transformers and inductors.

DESCRIPTION OF THE RELATED TECHNOLOGY

Transformers and inductors are widely known electromagnetic components used in electrical devices and power supply units. In general, static magnetic components such as transformers and inductors have traditionally been constructed using windings of ordinary conducting wire having a circular cross section. The conventional transformer comprises an insulator gap between a primary coil and a secondary coil, and the voltage generated in the secondary coil is determined by the voltage applied to the primary coil multiplied by the winding ratio between the primary coil and the secondary coil. Manufacture of these traditional structures involves winding the wire around a core or bobbin structure, a process that often involves considerable amounts of expensive hand labor. Furthermore, high power applications often require a magnetic component having a bulky core and large wire sizes for the windings. Even though transformers and inductors are often essential components of an electrical apparatus, they have been historically the most difficult to miniaturize.

New operational requirements with respect to circuit size and power density and the increasing necessity to reduce circuit manufacturing costs have made the traditional static magnetic component very unattractive as a circuit component. Newly designed circuits, for example, need low profiles to accommodate the decreasing space permitted to power circuits. Attaining these objectives has required the redesign of magnetic components to achieve a low profile and a low cost component assembly.

Planar magnetic components fabricated with flexible circuit and multi-layer printed circuit board (PCB) technologies offer an alternative to address the new operational and cost requirements. With planar technology, transformers have been formed from single or multi-layered printed circuit boards. FIG. 1A illustrates an example of a typical planar transformer constructed from printed circuit boards. Specifically, FIG. 1A depicts a side view of such a component 100 attached to the main board 110 of an electrical device. The component 100 includes a PCB 130 with multiple internal layers. Windings of the PCB 130 are connected to the main board by connecting pins 140 and 150. FIG. 1B illustrates the manner in which the component 100 is assembled and FIG. 2 schematically depicts the individual layers of the PCB 130.

The basic construction of the component 100 comprises a spiral conductor on each layer of the PCB 130 forming one or more inductor "turns." As shown in FIG. 1B, the core 120 can comprise two separate and identical E-shaped sections 122 and 124. Each E-shaped section 122, 124 includes a middle leg 126 and two outer legs 128. A hole 132 is drilled in the center of the PCB 130. The middle leg 126 of the E-shaped section 122, 124 can be supported within the hole 132 to form part of the core 120. The middle leg 126 has a circular cross-section and each of the outer legs 128 has a circular or rectangular cross-section. The remaining section of the E-shaped sections 122, 124 is formed by a ferrite bar, which is bonded to the legs 126, 128. The E-shaped sections 122, 124 are assembled so that the legs 126, 128 of each E-shaped section are bonded together. Primary and secondary pins connecting the primary and secondary windings, respectively, can penetrate the PCB via terminal holes 134 drilled near the outer edges of the PCB as will be explained below.

The width of the spiral conductor depends on the current carrying requirement. That is, the greater the current carrying requirement, the greater the width of the conductor. Typically, a predetermined area is reserved for the inductor and the one or more turns are printed on each layer according to well known printed circuit board technology. (See, for example, U.S. Pat. No. 5,521,573.) After each layer is so printed, the layers are bonded together into a multi-layer PCB by glass epoxy. Through-hole "vias" or blind "vias" are used to interconnect the turns of the different layers.

A through-hole via is formed by drilling a hole through the layers at a position to intersect ends of two of the spiral conductors and then "seeding" the inner surface of the holes with a water soluble adhesive. Next, copper is electrolessly plated on the adhesive to interconnect the conductors. Next, additional copper is electrically plated over the electroless copper plate to the desired thickness. Finally, the holes are filled with solder to protect the copper plate. A separate via is required for each pair of spiral conductors on adjacent layers to connect all of the turns in series. Each such through-hole via is positioned not to intersect the other conductors.

Drilling holes in selected layers before the layers are bonded together forms a "blind" via. Then, the layers are successively bonded together and, while exposed, the inner surface of the holes is seeded with nickel, electrolessly plated with copper and then filled with solder. The resultant vias extend between the two layers sought to be electrically connected. Thus, the hole does not pass through other layers, and no area is required on these other layers to clear the via. However, the blind via fabrication process is much more expensive than the through-hole fabrication process. Referring back to FIG. 1A, primary pins 140 connecting the primary windings (not shown) and secondary pins 150 connecting the secondary windings (not shown) are then positioned to penetrate the multi-layer PCB 130.

FIG. 2 illustrates a process for manufacturing a printed coil with conventional planar technology in a PCB. In the layers of the PCB of FIG. 2, a primary winding and secondary winding can be formed by connecting multiple coil traces from five layers 200, 220, 240, 260, and 280. The primary winding, for example, can have an outside terminal 202 connected to a coil trace 204 on layer 200. The inside terminal of the coil trace 204 can be connected to an inside terminal of a connection trace 242 on layer 240 by an inner peripheral terminal 208 through a via. The outside terminal of the connection trace 242 is connected by a primary terminal 210 through a via to an outside terminal 282 of a coil trace 284 on layer 280. The inner terminal of the coil trace 284 is connected to the inner terminal of connection trace 244 on layer 240 by a peripheral terminal 286 through a via. Connection trace 244 is connected to outside terminal 246, thereby forming a primary winding between outside terminals 202 and 246 from coil traces 204 and 284 on layers 200 and 280, respectively.

A secondary winding can be formed by connecting a coil trace 224 on layer 220 and a coil trace 264 on layer 260 in a similar fashion. An outside terminal 262 of coil trace 264 can be connected through a via to a corresponding outside terminal 222 of coil trace 224 by a primary terminal 266. The inside terminal of coil trace 224 is connected to the inside terminal of coil trace 284 through a via by peripheral terminal 226. Because the inside terminal of each coil trace 224 and 264 is connected and the outside terminals of each coil trace 224 and 264 is connected, the coil trace 224 and the coil trace 264 are connected in parallel.

FIG. 3 illustrates a typical twelve-layer layout where each individual layer is shown separately. These layers can be connected in a fashion similar to that described above with reference to FIG. 2 to form a PCB having a primary winding and a secondary winding. In this conventional layout, a twelve layer PCB includes traces of both the primary and secondary windings as similarly described with reference to FIG. 2. However, as a result, the primary and secondary windings are physically positioned near or in actual contact with one another, creating significant risks of electrical flashover.

FIG. 4 schematically illustrates how a primary winding and a secondary winding from a PCB can be arranged as a transformer. Referring again to FIG. 2, the windings traced on the layers of a PCB can form a primary winding with external terminals 202 and 282 and a secondary winding with external terminals 226 and 262. As shown in FIG. 4, a primary winding 420 can be connected to the main board 110 by pins 430 and 440 at terminals 202 and 282. A secondary winding 460 can be connected to the main board 110 by pins 470 and 480 at terminals 226 and 262. The primary winding 420 is configured across from the secondary winding 460 with the dielectric material of the core 120 positioned therebetween and represented by lines 490.

While a considerable improvement over traditional construction of magnetic components, these arrangements still fail to meet the performance and cost objectives of contemporary circuit designs. In particular, this conventional planar arrangement poses significant design, cost, and operational disadvantages.

As discussed above, applications today are increasingly demanding space restrictions for their design. Consequently, efforts are continuing to further reduce the size of electrical components. Power supplies, for example, have been significantly reduced in size over the past few years. As a result, the space available for the planar magnetic component is extremely limited. Therefore, the current twelve layer arrangement in conventional planar technology offers a significant obstacle to miniaturizing circuit designs.

Closely tied to the current and ongoing size constraints are the ever-increasing demands for less expensive and more reliable applications. The conventional twelve-layer planar components also prove to be extremely costly. The conventional planar magnetic component must be customized for each circuit design depending on the parameters required (e.g., the turn ratio). If the parameters change, then a new planar magnetic component must be custom manufactured. Manufacture of the magnetic components using conventional planar technology therefore requires substantial costs associated with each new PCB configuration built for each and every circuit parameter change.

Moreover, the current planar technology raises serious operational problems associated with high potential (HIPOT) applications as well. The pins in the conventional boards penetrate the PCB layers in various locations and generally propagate through the thickness of most or all of the layers; however, only certain pins are electrically bonded to certain layers. Because of the manner in which the pins in the conventional planar components fully penetrate the boards in various locations, with only certain pins electrically bonded to certain layers, significant risks of failure due to an electrical flashover exist. Lastly, such many layer boards require significant pressure to laminate them together, thereby generally creating higher shear forces on the layers during manufacture. The resulting lateral movement of each individual layer relative to the layers above and below can cause significant defects to the operation of the component and, in particular, can infringe the minimum space needed between primary and secondary windings.

Accordingly, there is a need for a static electro-magnetic component which not only satisfies demanding operational and size requirements of current electronic technology but also avoids the flashover problems and high costs of the current planar technology. Furthermore, there is a need for an electrical device which offers the additional benefit of providing a configurable and customizable capability allowing a user to change parameters of the component to suit the needs of a particular application.

SUMMARY OF THE INVENTION

The embodiments of the invention described below offer an integrated magnetic component utilizing multi-layer stackable PCBs and combine the storage capability of an inductor with the step up, step down or isolation benefits of a transformer in a single structure for high frequency, high density, direct current to direct current (DC—DC) SMPS converters. The novel arrangement of this invention along with its customizable configuration can overcome the disadvantages and problems associated with the prior art.

One embodiment of the invention includes a plurality of core members and a plurality of printed circuit boards stacked into a multi-layer configuration between the core members. A first printed circuit board is configured to form a primary winding of a transformer. A second set of printed circuit boards is configured to form a secondary winding of a transformer. A conductive plate is configured as an output inductor turns. Connector pins are configured to electrically connect the plurality of printed circuit boards to the main circuit board. Each connector pin penetrates only printed circuit boards containing the primary winding or the printed circuit boards containing the secondary winding.

Another embodiment includes three ferrite core portions. One core portion is used in the transformer and one core portion is used in the inductor, and the transformer and the inductor share the middle core portion. The windings of the transformer and the inductor are connected so that the flux created by the transformer and the flux created by the inductor subtract from each other, thereby minimizing the size of core portion shared by the transformer and inductor.

Another embodiment comprises a method of manufacturing an electrical device including printing at least one coil on each of a plurality of printed circuit boards, configuring electrical connections on the plurality of printed circuit boards to include the coils on the printed circuit boards so as to define a primary winding and a secondary winding. A conductive plate is configured as an output inductor. The printed circuit boards and conductive plate are configured in a stacked arrangement, and the conductive plate, the primary winding on the printed circuit boards and the secondary winding on the printed circuit boards are connected to a main circuit board with connector pins in such a manner that the connector pins connecting the primary winding only penetrate printed circuit boards containing the primary winding and connector pins connecting the secondary winding only penetrate printed circuit boards containing the secondary winding.

BRIEF DESCRIPTION OF THE DRAWINGS

FIG. 1A is a side sectional view of a magnetic component employing the conventional planar technology.

DETAILED DESCRIPTION OF THE INVENTION

Figure 5:
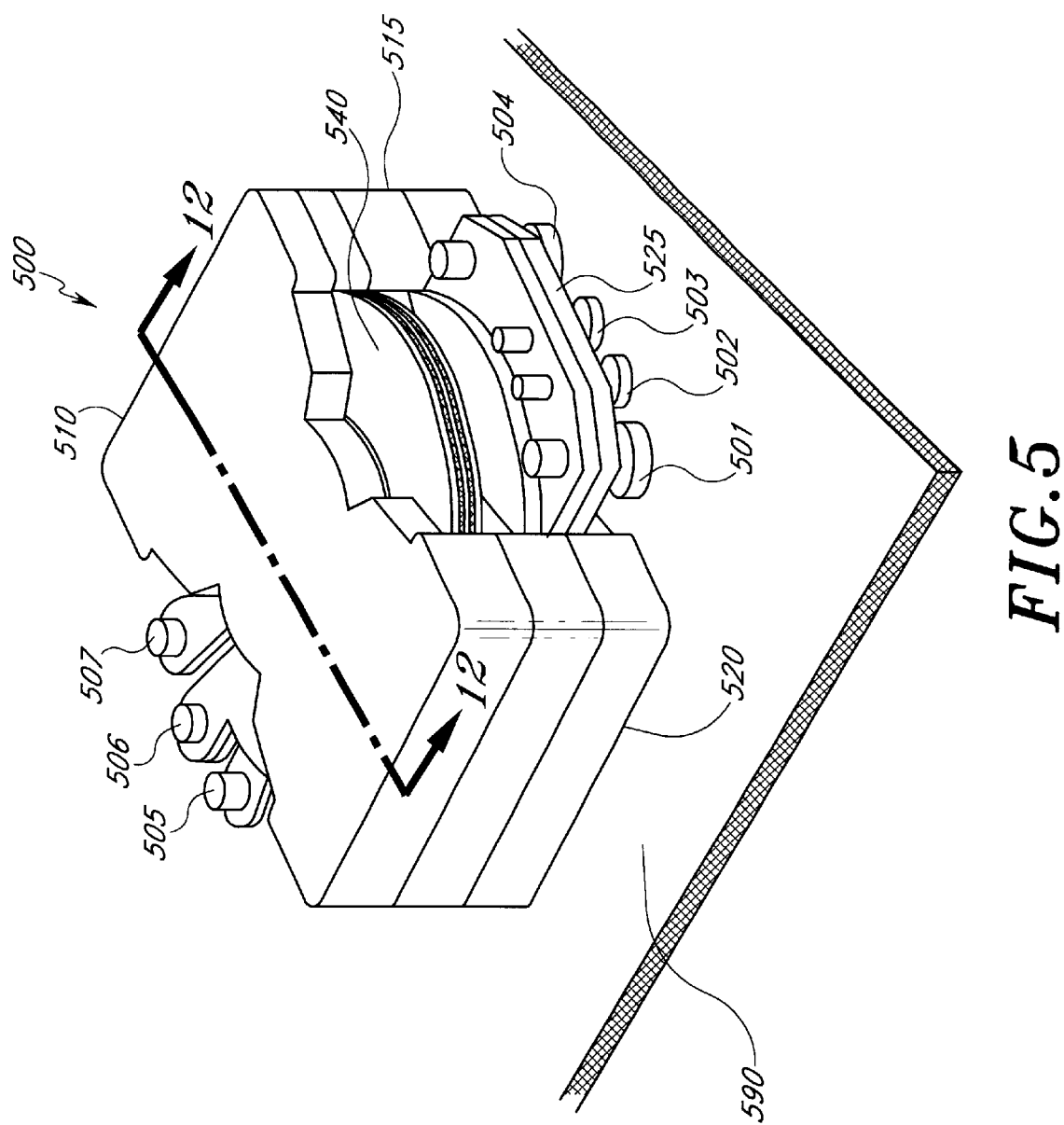
FIG. 5 is a perspective posterior view showing one embodiment of an integrated magnetic component.
Figure 6:
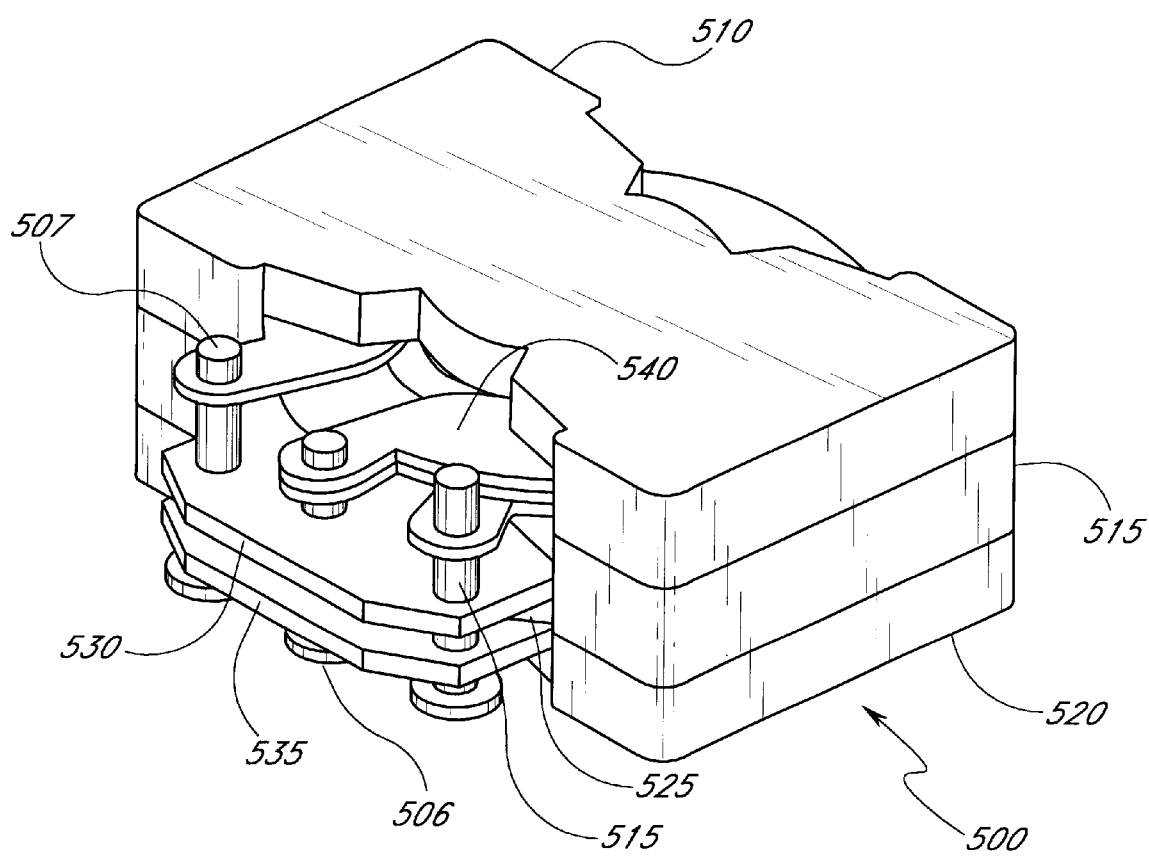
FIG. 6 is a perspective anterior view showing the integrated magnetic component of FIG. 5.

FIGS. 5 and 6 are perspective views of one embodiment of an integrated magnetic component 500. The integrated magnetic component 500 utilizes multi-layer stackable PCBs and combines the storage capability of an inductor with the step up, step down or isolation benefits of a transformer in a single structure for high frequency, high density, direct current to direct current (DC—DC) SMPS converters. The integrated magnetic component 500 includes an upper core portion 510, a center core portion 515 and a lower core portion 520: A copper plate 540 is positioned between the upper core portion 510 and the center core portion 515.

Referring to the posterior view shown in FIG. 5, a primary PCB 525 is positioned between the lower core portion 520 and center core portion 515. Referring to the anterior view shown in FIG. 6, two secondary PCBs 530, 535 are also positioned between the lower core portion 520 and the center core portion 515. The PCBs 525, 530, 535 are multi-layer PCBs, however, single layer PCBs can be used. As shown in FIGS. 5 and 6, the primary PCB 525 is "sandwiched" between the secondary PCBs 530, 535.

Seven connecting pins 501, 502, 503, 504, 505, 506 and 507 penetrate the stacked PCBs 525, 530, 535 and the copper plate 540 as described below. Alternatively, more or fewer pins can be used as required. The pins 501, 502, 503, 504, 505, 506 and 507 act to connect the various outside terminals of windings (not shown) embedded in each PCB 525, 530, 535 and the copper plate 540 to a main circuit board 590.

Figure 7:
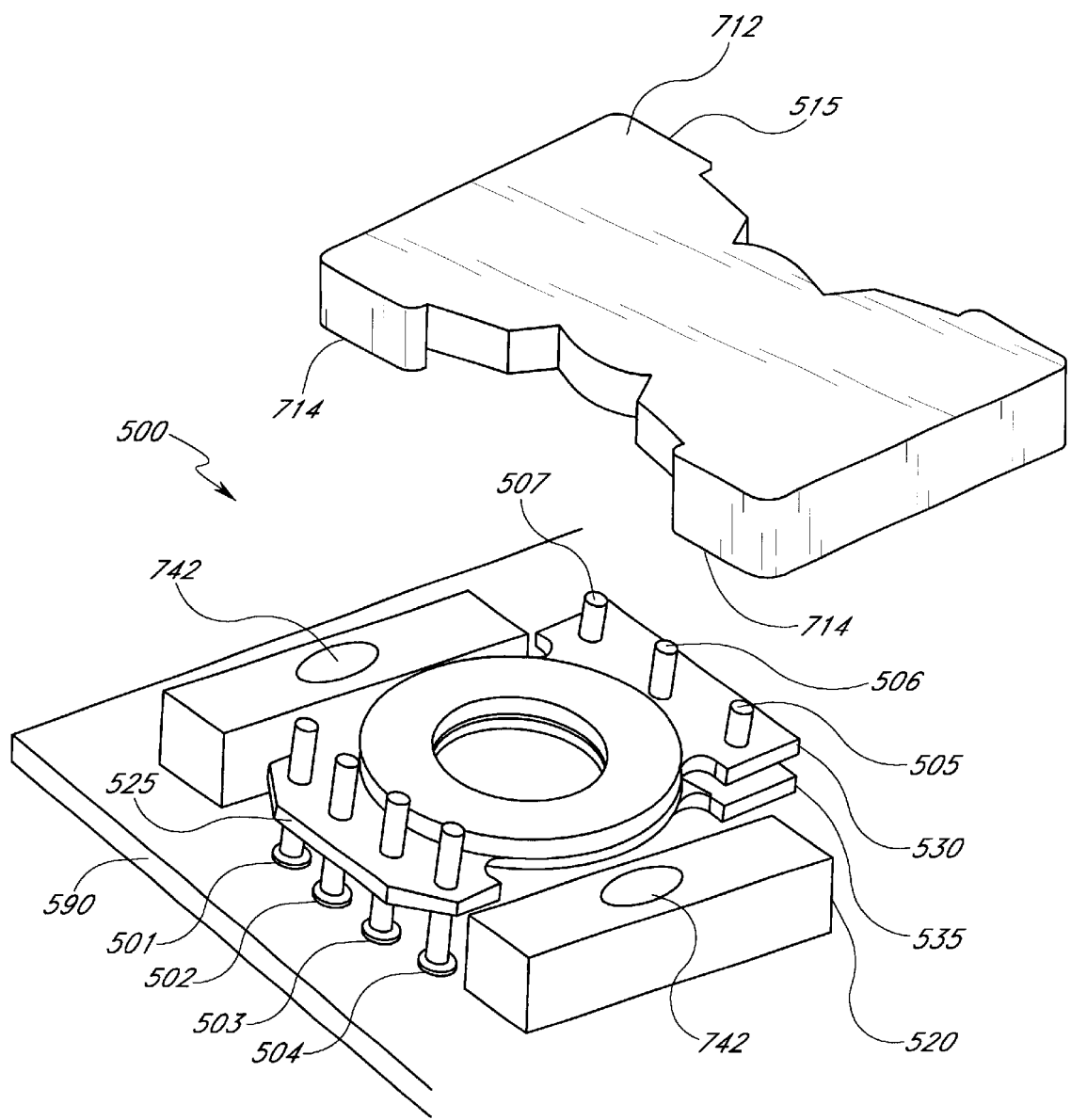
FIG. 7 is an exploded perspective view of the integrated magnetic component of FIG. 5 with the upper core portion and the copper plate removed.

FIG. 7 is an exploded perspective view of an embodiment of the integrated magnetic component 500 with the upper core portion 510 (not shown) and the copper foil 540 (not shown) removed for clarity. The primary PCB 525 and the two secondary PCBs 530 and 535, are laid onto the lower core portion 520. The PCBs 525, 530, and 535 have hollow centers to accommodate a cylindrical member (not shown) of the center core portion 515 and a cylindrical member (not shown) of the lower core portion 520. Therefore, as the PCBs 525, 530, and 535 are placed on the lower core portion 520, the cylindrical member of the lower core portion 520 fits into the hollow centers of the PCBs 525, 530, and 535. Similarly, as the center core portion 515 is placed on top of the lower core portion 520, the cylindrical member of the center core portion 515 passes through the hollow centers of the PCBs 525, 530, and 535. The core portions 515 and 520 and the cylindrical member passing through the hollow centers of the PCBs 525, 530, and 535 are manufactured from a ferrite material.

Figure 1B:
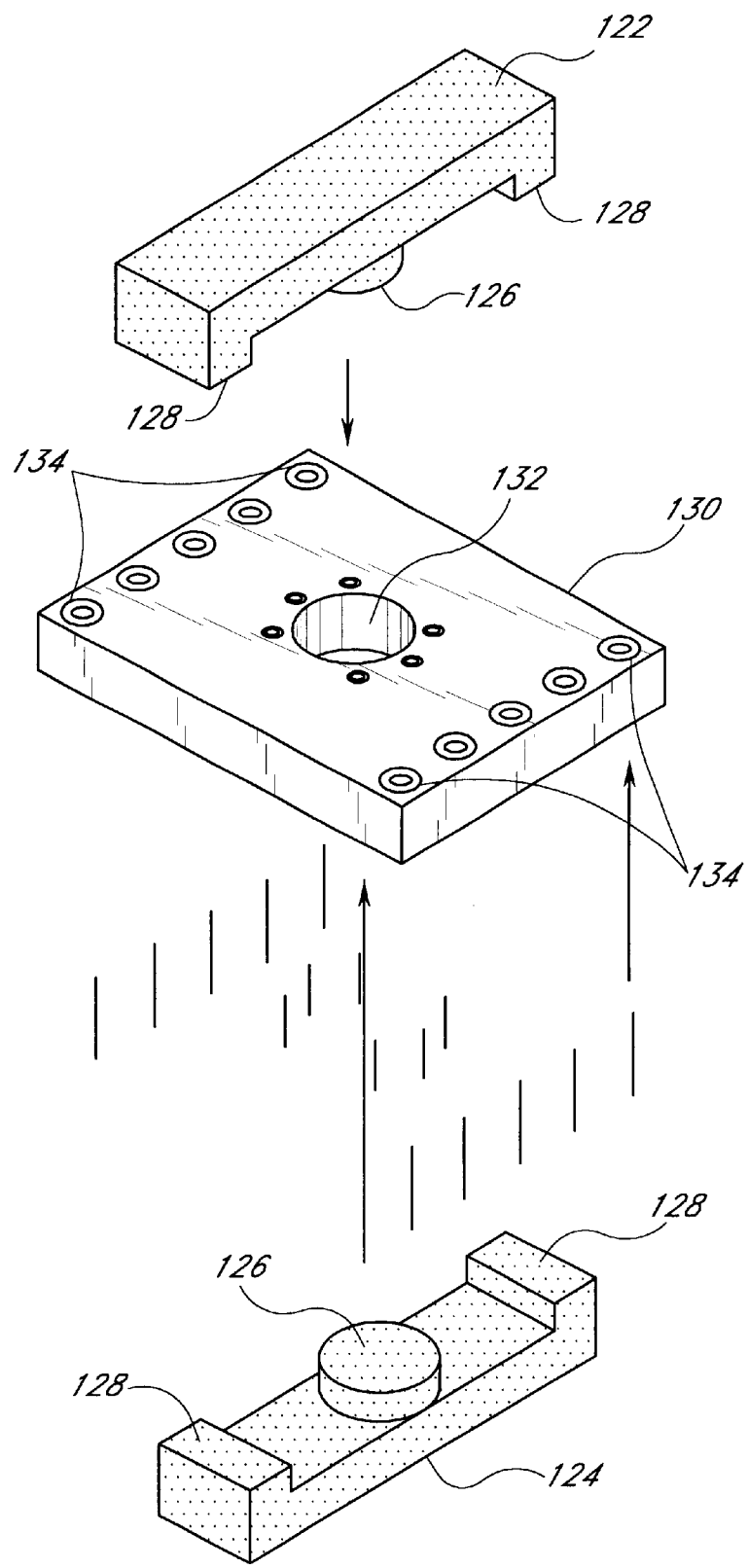
FIG. 1B is an exploded perspective view of the magnetic component of FIG. 1A.

The center core portion 515 is configured with a flat upper surface 712. The surface opposite the flat upper surface 712 is configured with two support members 714 on opposing ends of the center core portion 515. The support members 714 run the width of the center core portion 515. The cylindrical member (not shown) of the center core portion 515 is centered on the surface opposite the flat outer surface 712. This configuration resembles the "E-shape" of the cores used in the conventional planar technology described above and depicted in FIG. 1B.

The lower core portion 520 is configured to substantially define a mirror image of the center core portion 515. The center core portion 515 can then be secured to the lower core portion 520 by an adhesive placed on surfaces 742 of the support members 714 of the lower core portion 520. Alternatively, the lower core partitions can be joined using fasteners or snap connections. When the support members 714 of the core portions 515 and 520 are mated together at surfaces 742, the cylindrical member (not shown) of the center core portion 515 and the lower core portion 520 are positioned to pass through the hollow centers of the PCBs 525, 530, and 535 and contact each other.

Figure 8:
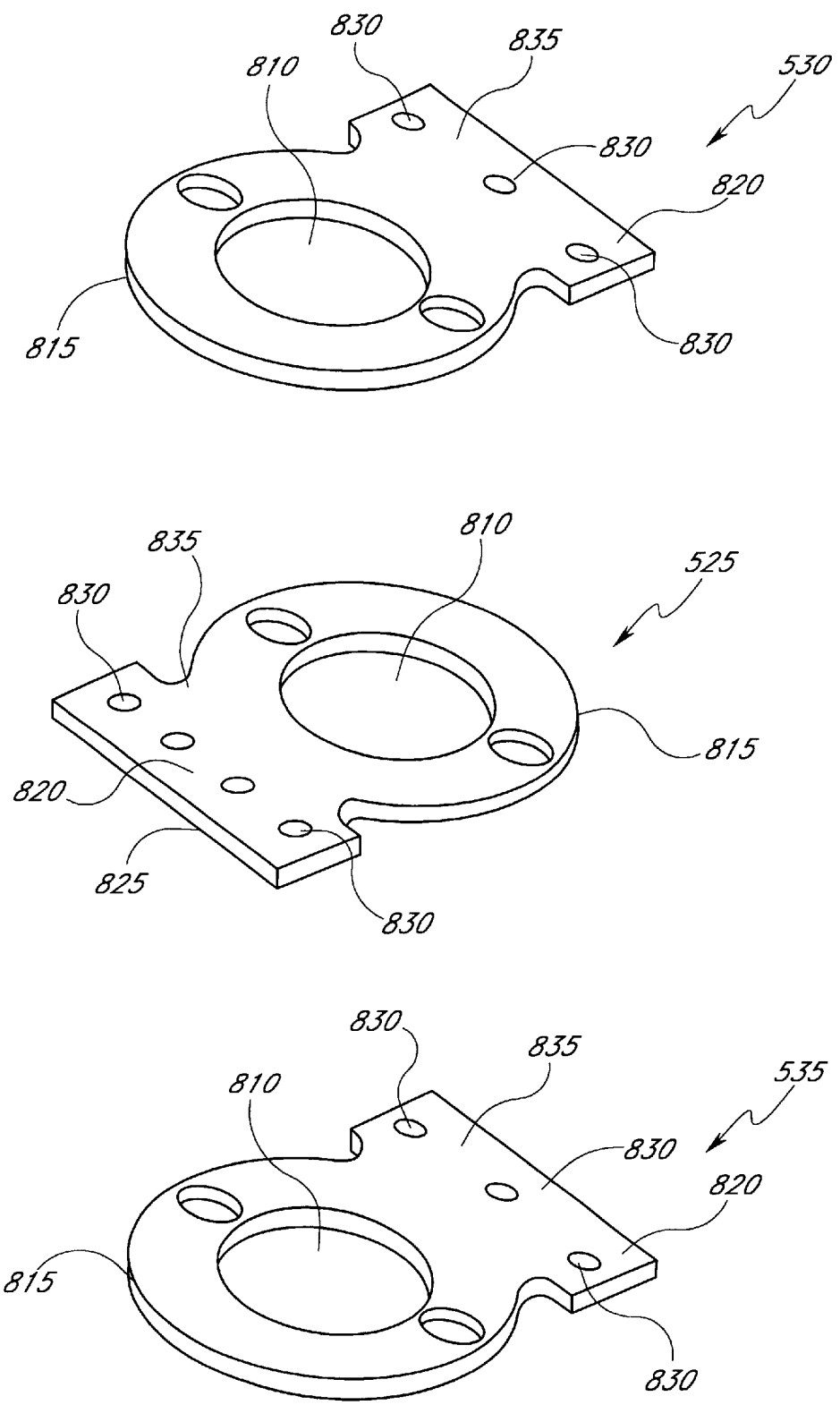
FIG. 8 is an exploded perspective view showing a primary PCB including a primary winding and a secondary PCB including a secondary winding.

Referring now to FIG. 8, the primary PCB 525 and the secondary PCBs 530, 535 each are generally formed as flat boards. Each of the PCBs 525, 530, 535 has a circular portion 815 which is substantially circular in shape with a hollow center 810. As described above, the diameters of the hollow centers 810 of the PCBs 525, 530, 535 are substantially equal and can accommodate the diameter of the cylindrical member of the center core portion 515. Each of the PCBs 525, 530, 535 has an attachment region 820 which is substantially rectangular in shape on three sides with a leading edge 825 parallel to a tangent of the outer edge of the circular shape. The attachment region 820 has a width substantially as wide as the annuli of the circular portions 815 of the PCBs 525 and 530. The attachment region 820 of each PCB 525, 530, 535 also preferably includes a plurality of holes 830 to accommodate connecting pins. Moreover, each attachment region 820 provides a conductive surface through which pins connecting the PCBs 525, 530, 535 can attach in order to connect winding traces.

Figure 9:
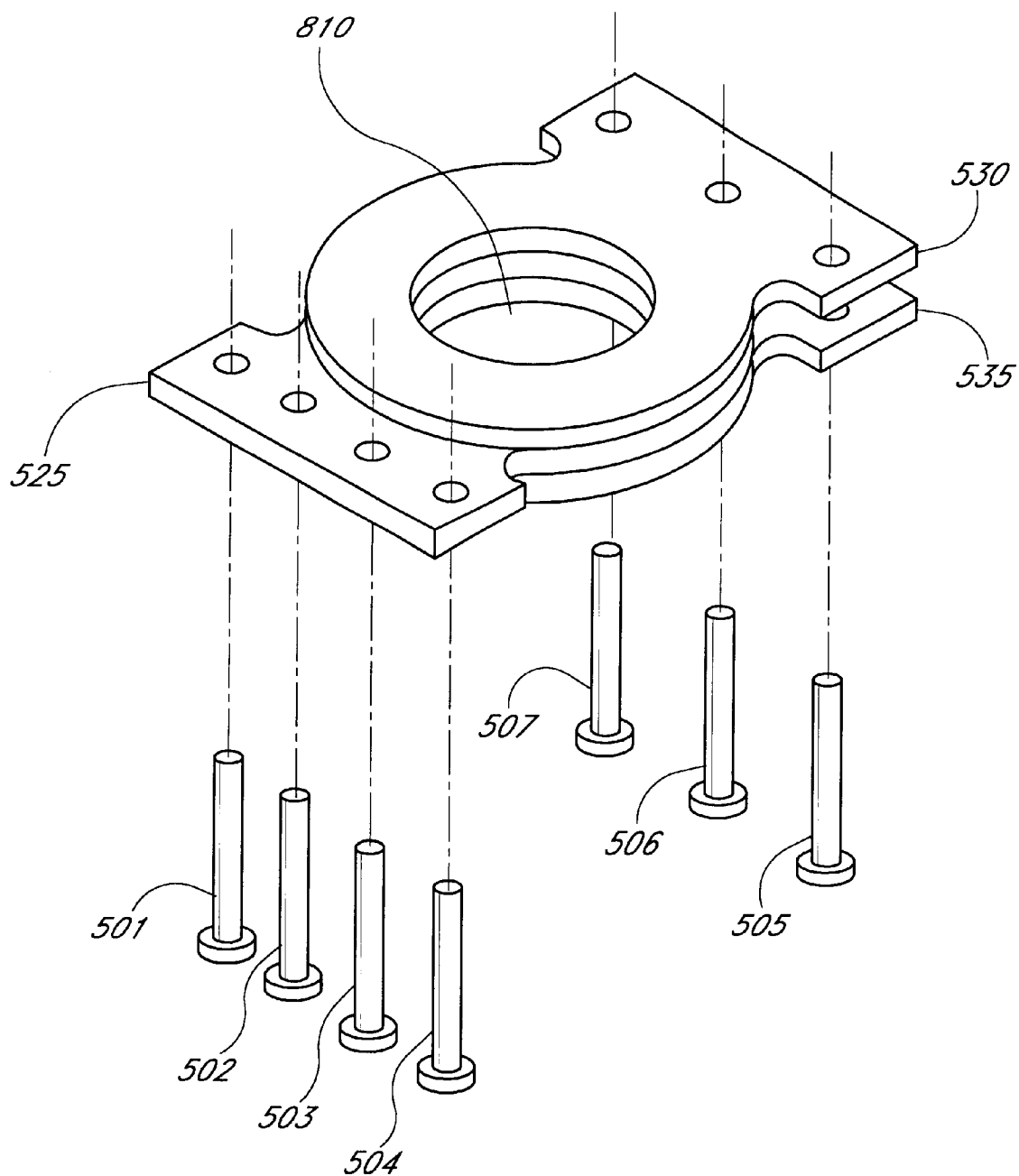
FIG. 9 is a perspective view showing the primary PCB of FIG. 8 positioned between two secondary PCBs.

FIG. 9 depicts the magnetic component 500 without the core portions 510, 515 and 520 and the copper foil 540. The magnetic component 500 utilizes the three multi-layered PCBs 525, 530, and 535, which are sandwiched together as described above.

The electrical conducting pins labeled 501, 502, 503 and 504 penetrate the primary PCB 525; the electrical conducting pins 505, 506, and 507 penetrate the secondary PCBs 530 and 535. The primary PCB 525 is positioned so that the attachment region 820 of the primary PCB 525 is directly opposite the attachment region 820 of the secondary PCBs 530 and 535. As a result of this configuration, the pins 501, 502, 503 and 504 only penetrate the primary PCB 525 and make an electrical connection with the winding on PCB 525 and the pins 505, 506, and 507 only penetrate the secondary PCBs 530 and 535 and make an electrical connection with the winding on PCBs 530 and 535. Therefore, no physical or electrical connection exists between the primary windings and the secondary windings. As a result, the significant risks of failure due to an electrical flashover can be minimized.

Figure 2:
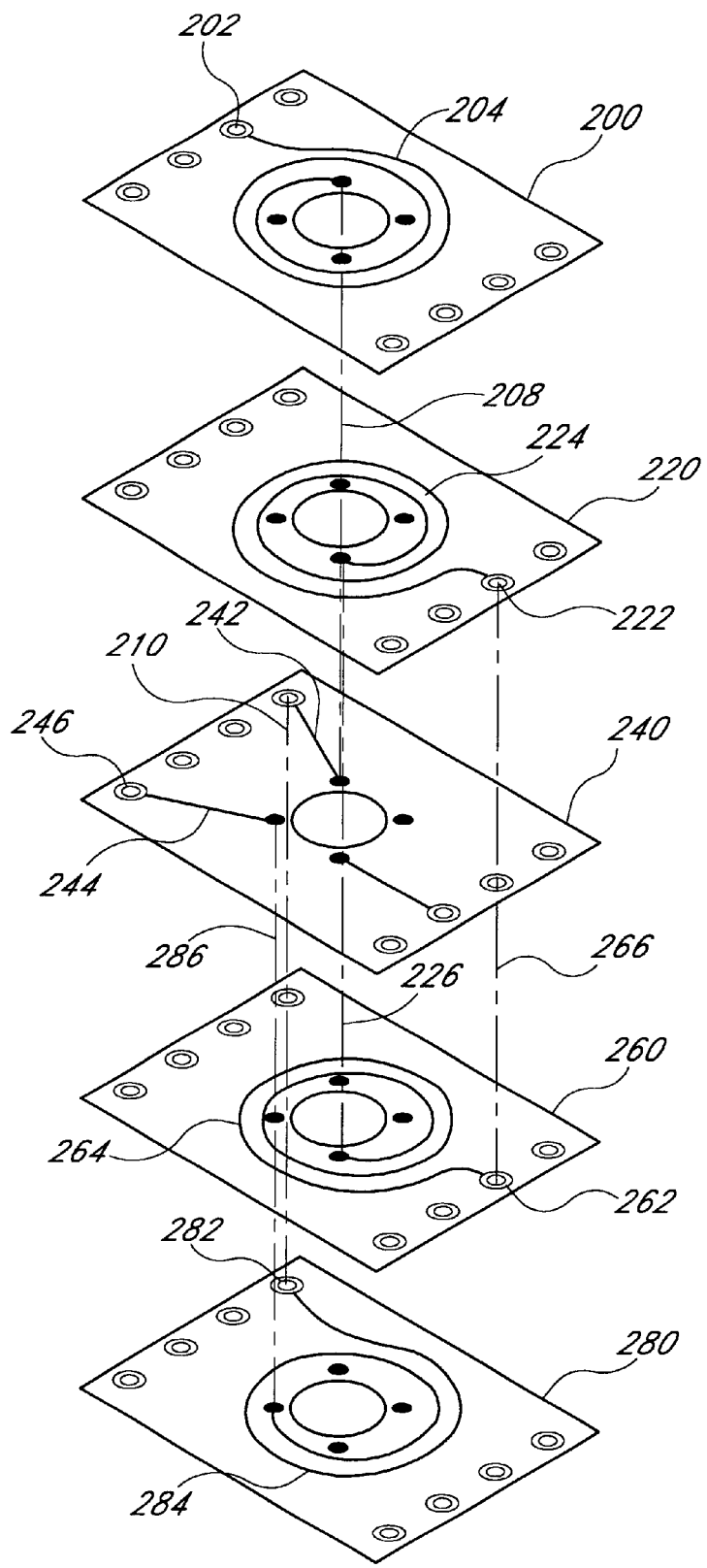
FIG. 2 is an exploded perspective view of layers of a PCB used in a magnetic component.

Each PCB can comprise single or multiple layers, such as, for example, four, six or any other necessary number of layers. Each layer includes an individual winding (either primary or secondary) with a predetermined number of turns. These windings are formed using the conventional technology described in reference to FIG. 2, above. As a result, new designs with different turn ratios can be configured in a short time by simply replacing a particular PCB with another PCB with different turn ratios. This flexibility in permitting user-configuration with a reduced number of layers of PCBs helps to reduce the overall cost of the component.

Recall that the conventional planar technology included both the primary and secondary winding in a single twelve-layer PCB. Moreover, the configuration of these windings (e.g., whether in parallel or in series) was predetermined by the particular connections used for the traces. Consequently, in order to change the turn ratios or parameters of the conventional magnetic component, a new PCB would need to be designed and manufactured.

Figure 10:
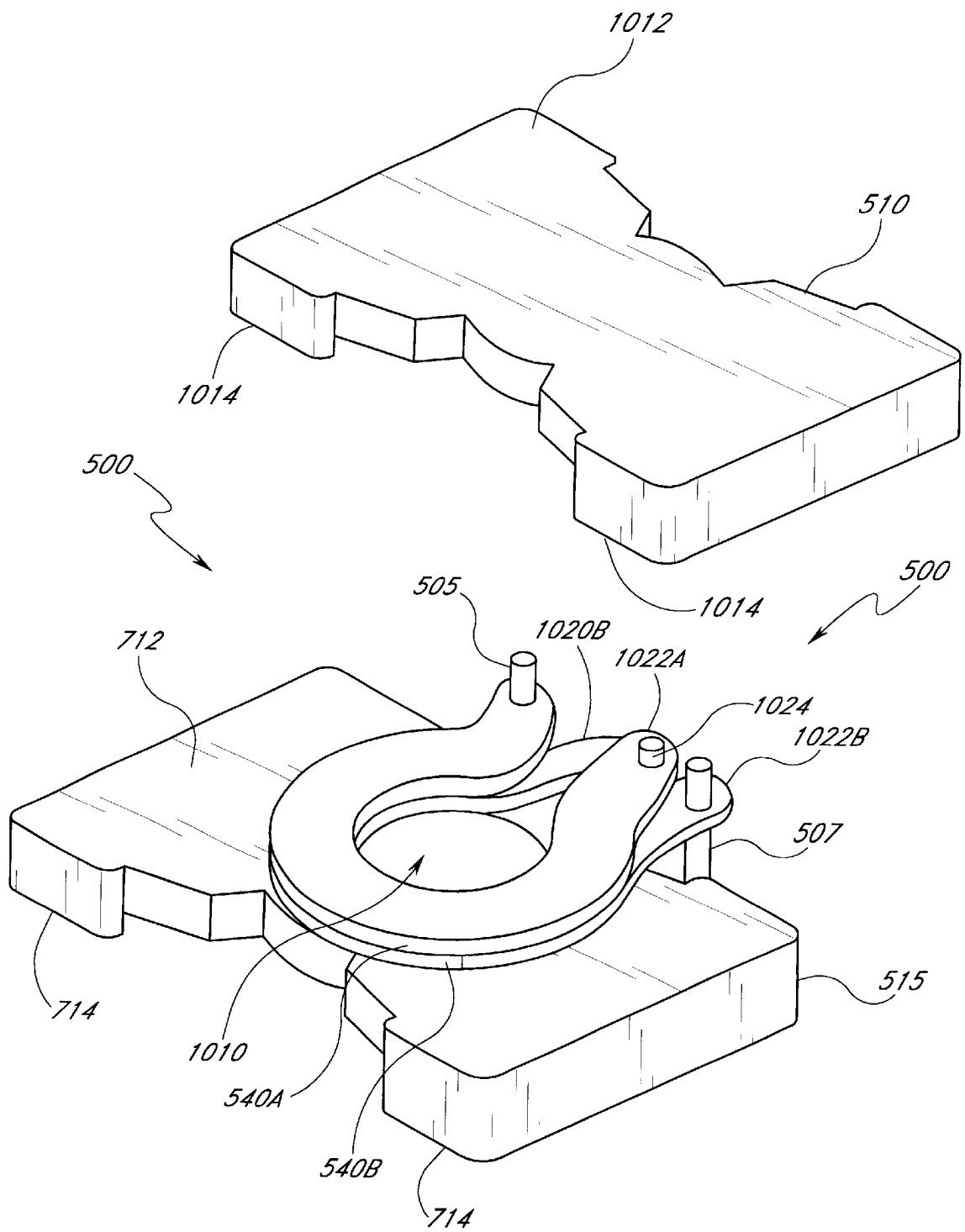
FIG. 10 is an exploded perspective view showing the integrated magnetic component of FIG. 5 with the lower core portion and PCBs removed.

FIG. 10 is an exploded perspective view of one embodiment of the integrated magnetic component 500 with the lower core portion 520 (not shown) and the PCBs 525, 530 and 535 (not shown) removed for clarity. The upper core portion 510 facing the center core portion 515 is configured as substantially a mirror image of the center core portion 515 and is placed on the center core portion 515 in substantially the same manner that the center core portion 515 was placed on the lower core portion 520 as described above. The upper core portion 510 also has a flat outer surface 1012 and is configured with two support members 1014 on opposing ends of the upper core portion 510, thereby fonning a recess that defines a gap 1016 when the upper core portion 510 is received in position adjacent the center core portion 515. The upper core portion 510 also has a cylindrical member (not shown) centered in the gap 1016. The cylindrical member of the upper core portion 510 is not as long as the two support members 1014. As the upper core portion 510 is positioned with the support members 1014 adjacent to the flat upper surface 712 of the center core portion 515, the cylindrical member of the upper core portion 510 does not contact the flat upper surface 712 of the center core member 715.

FIG. 10 illustrates an embodiment where two substantially similar copper plates 540A and 540B are positioned on the upper core portion 510. Alternatively, one or more copper plates 540 can be used. The copper plates 540A, 540B are positioned on the upper core portion 510 so that a hollow center 1010 of the copper plates 540A and 540B accommodates the cylindrical member of the upper core portion 510. The copper plates 540A, 540B are substantially circular in shape across a significant portion of their bodies, with a gap separating opposite ends which are angled outwardly from the circular portion to define a first tab 1020A, 1020B and a second tab 1022A, 1022B on the respective copper plate. The connecting tab 1020A of copper plate 540A connects to pin 505. The connecting tab 1022B of copper plate 540B connects to pin 507. The connecting tab 1022A and 1020B are connected by pin 1024. Connecting two copper plates 540A, 540B in this manner gives the copper plate 540 the effect of having multiple turns, each turn comprising a separate layer. This allows a lower DC resistance in the circuit and thereby minimizing the power loss and increasing the overall efficiency of the component.

Figure 11:
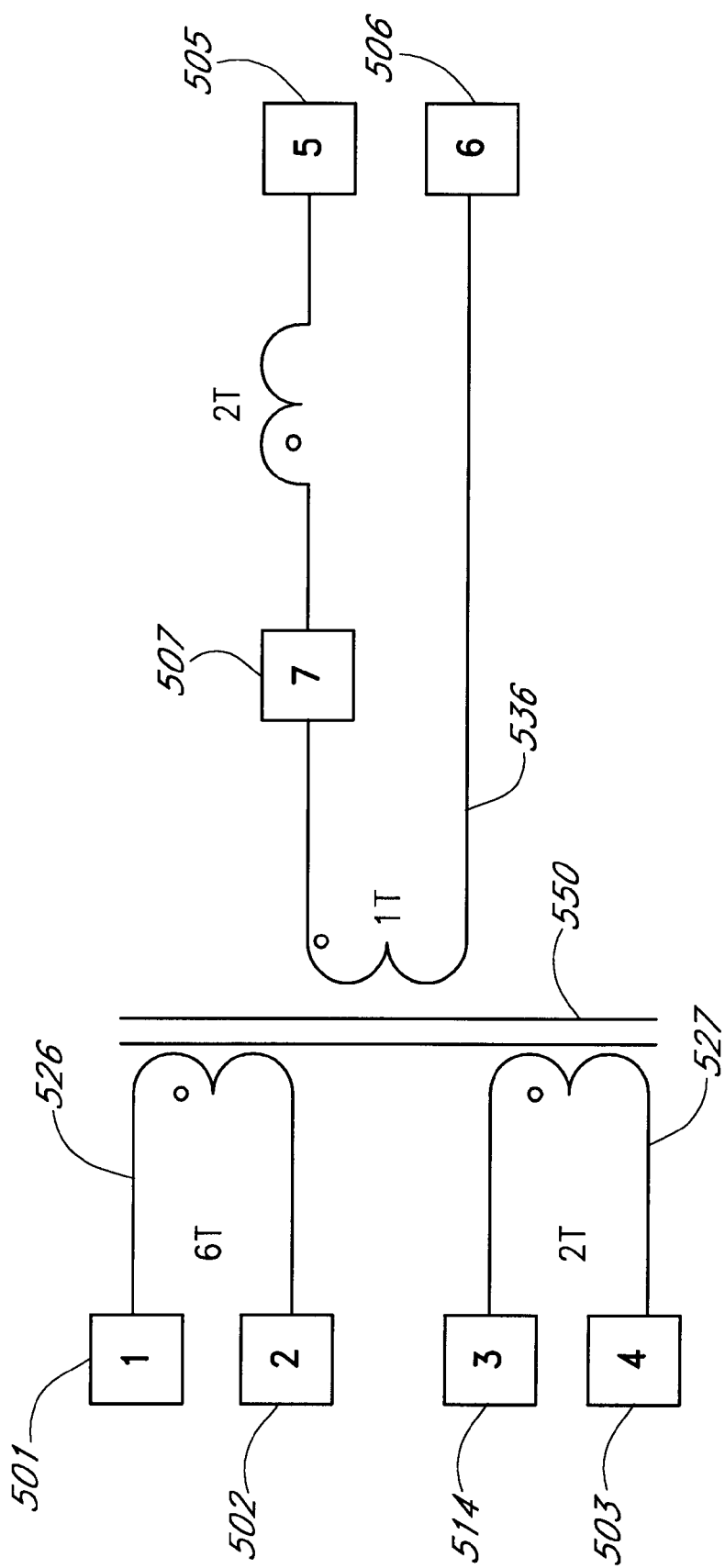
FIG. 11 is a schematic diagram of the equivalent circuit of the integrated magnetic component of FIG. 5.

The equivalent schematic diagram of the integrated magnetic component 500 is shown in FIG. 11. In this embodiment, the primary PCB 525 (not shown) includes a primary winding 526 and an auxiliary winding 527. The auxiliary winding 527 supplies a bias voltage for the main controller in the power supply (not shown). Pins 501 and 502 connect the primary winding 526 to the main circuit board 590 (not shown). Pins 503 and 504 connect the auxiliary winding 527 to the main circuit board 590 (not shown).

The secondary PCBs 530, 535 (not shown) include a secondary winding 536. The pins 506 and 507 are used to connect the secondary winding 536 to the main board 590 (not shown). The pins 505 and 507 are used to connect the copper plate 540 as an output inductor to the main circuit board 590 (not shown). The pin 507 is shared by both the secondary winding of the secondary PCBs 530, 535 and the copper plate 540, thereby reducing the total pin count by one.

As illustrated schematically, the pins 501 and 502 are connected to the primary winding 526 (with six turns shown in FIG. 11). The pins 503 and 504 are connected to the auxiliary winding 527 (with two turns shown in FIG. 11). The dielectric effect of the cylindrical member of the core portions 510 and 515 (not shown) placed through the holes 810 of the PCBs 525, 530, and 535 is represented by lines 550. The pins 506 and 507 are connected to the secondary winding 536 (with one turn shown in FIG. 11). The pin 507 is also used, along with pin 505, to connect the copper plate 540 as an output inductor (with two turns shown in FIG. 11).

The direct current (DC) input voltage from a DC—DC switch mode power supply (SMPS, not shown) and supplied to the primary winding 526 can be "chopped" according to the frequency and the duty cycle. Moreover, the "chopped" input voltage can be stepped up or stepped down according to the turn ratio of the transformer. The transformer can achieve the necessary isolation between the primary winding 526 and the secondary winding 536 and present an alternating current (AC) output voltage via the secondary winding 536 to the pins 506 and 507. The copper plate 540 acting as an output inductor can act to smooth the AC secondary voltage. Additionally, the output inductor formed by the copper plate 540 can store energy during the "on" time and passes the energy needed to the load during the "off" time. A main switch (not shown) located in the power supply can control the "on" and "off" times.

The component depicted in FIGS. 5, 6, 7, 10 and schematically illustrated in FIG. 11 can operate as both an inductor and a transformer within one integrated magnetic planar component. The integrated magnetic component 500 accomplishes this integrated functionality in a compact size by phasing the primary winding 526 and the secondary winding 536 so that the flux lines caused by the transformer subtract from the inductor flux lines.

Figure 12:
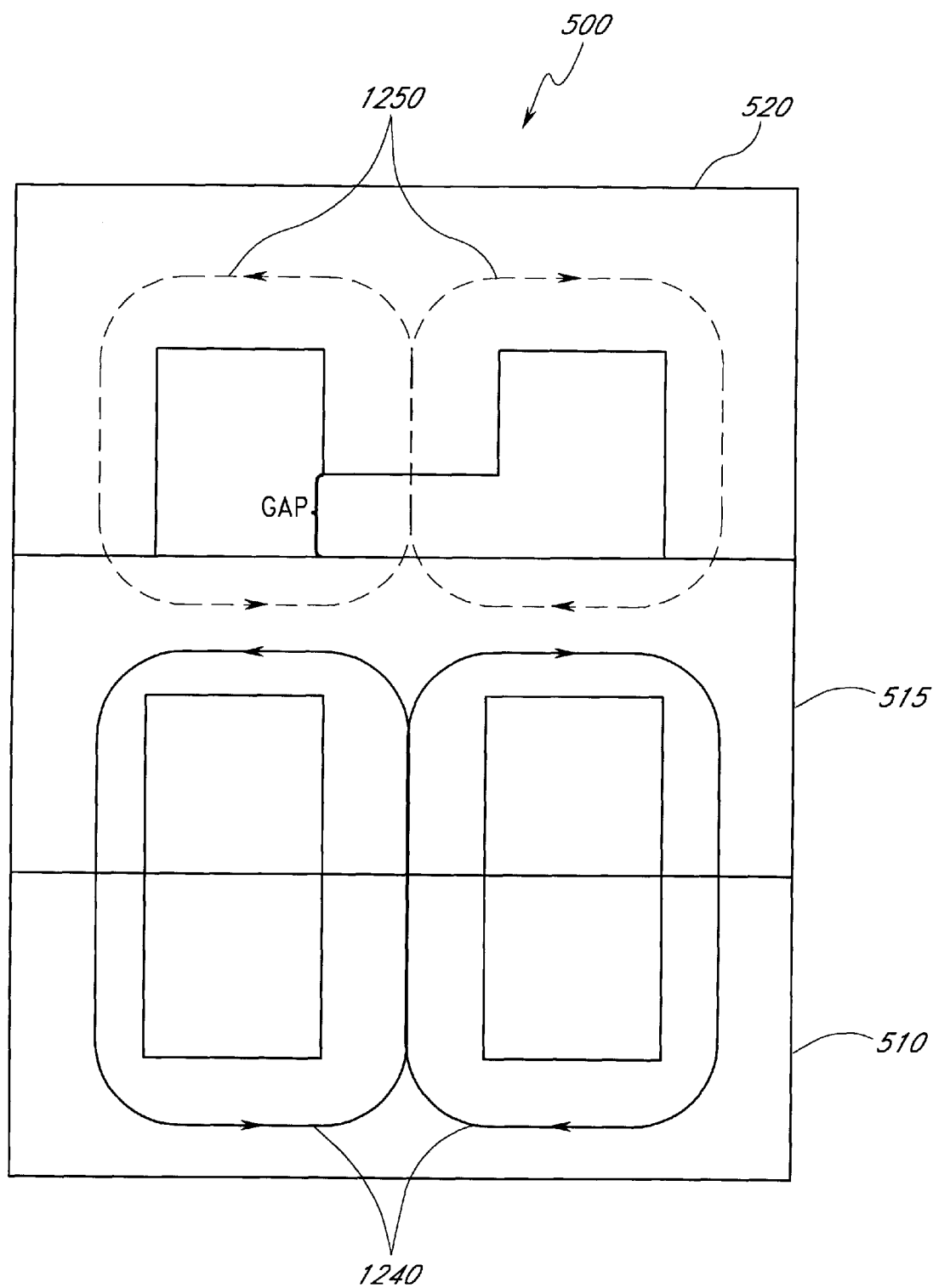
FIG. 12 is a cross-sectional view showing the integrated magnetic component core section taken along line 12—12 of FIG. 5.

FIG. 12 is a cross-sectional view of the integrated magnetic component 500 and illustrates how flux lines caused by the transformer, as indicated by lines 1240, subtract flux lines generated by the inductor, as indicated by lines 1250. As described above in reference to FIG. 10, the center core portion 515 can be sandwiched between the upper core portion 510 and the lower core portion 520. As a result of this configuration, the transformer flux lines 1240 and the inductor flux lines 1250 are forced across the center core portion 515 in opposite directions. The reluctance of the gap forces the transformer and the inductor to function independently and the flux subtraction can reduce the area required for the center core portion 515, thereby decreasing the height of the overall part.

Figure 13:
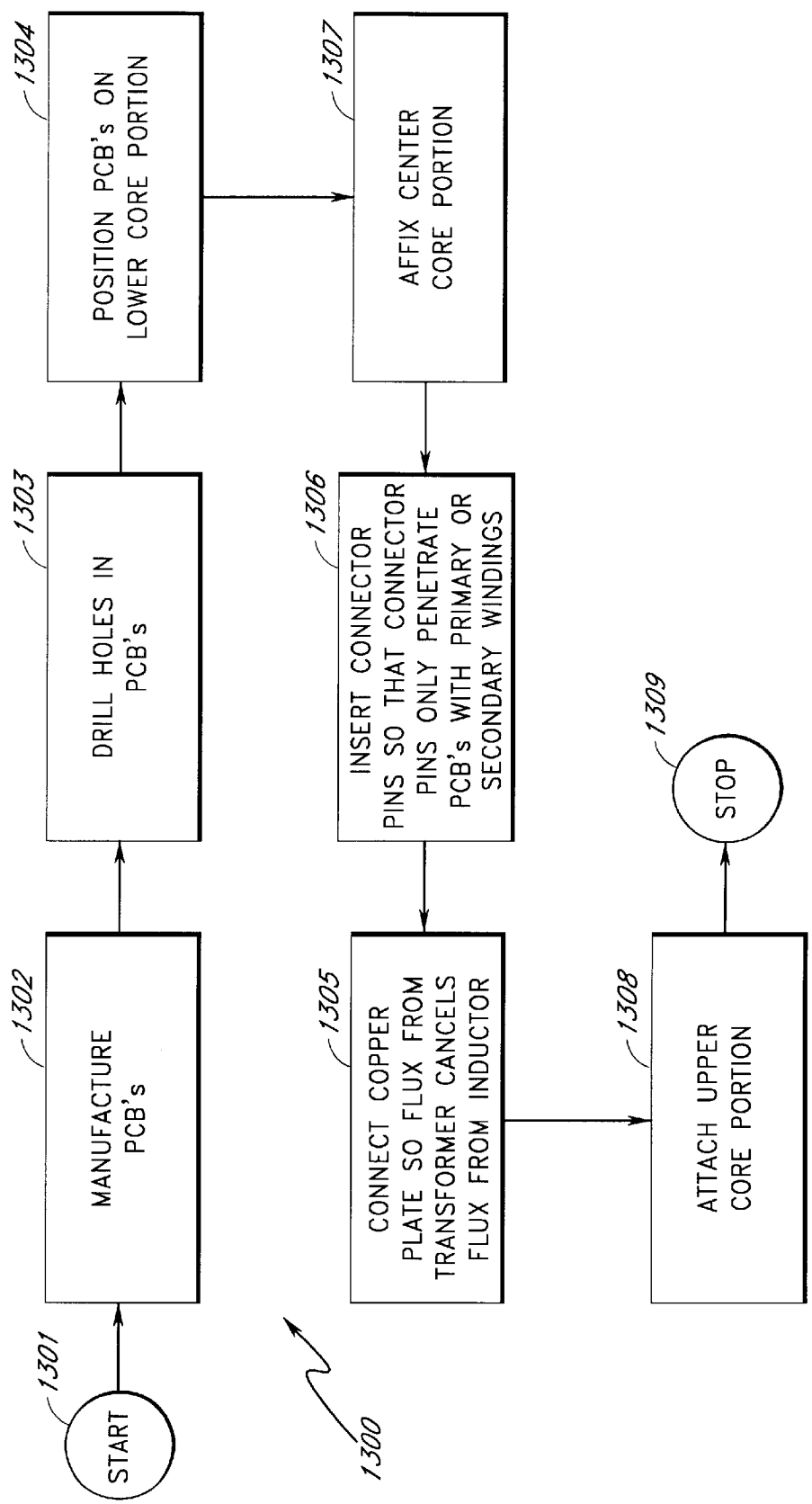
FIG. 13 is a flowchart demonstrating a method of creating the integrated magnetic component of FIG. 5.

FIG. 13 displays a method 1300 of manufacturing the integrated magnetic component 500. As shown in FIG. 13, the method 1300 is comprised generally of a series of process steps, several of which may be performed in parallel with other steps.

The method 1300 proceeds from a start step 1301 to a step 1302, wherein printed circuit boards 525, 530, 535 with multiple internal layers are printed as is common in the art. In step 1303, connection holes 830 are drilled in the printed circuit boards 525, 530, 535. In step 1304, the printed circuit boards 525, 530, 535 are placed on the lower core portion 520 in a manner such that the connection holes 830 for the printed circuit board 525 containing the primary winding 526 are on one side of the lower core portion 520 and the connection holes 830 for the printed circuit boards 530, 535 containing the secondary winding 536 are on the opposite side of the lower core portion core piece 520. In step 1305, the center core portion 515 is affixed to the lower core portion 520.

In the next step 1306, connector pins 501, 502, 503, 504, 505, 506, 507 are inserted into the connector holes 830 so that the primary winding 526 of the transformer is created on the first set of printed circuit boards 525, and the secondary winding 536 of the transformer is created on a second set of circuit boards 530, 535. In the next step 1307, the copper plate 540 is connected to select connector pins 505, 507 as described above so that the primary and secondary windings of the transformer create a flux in the center core portion 515 that opposes a flux created by the wiring of the copper plate 540 of the output inductor. In the next step 1308, the upper core portion 510 is attached to the center core portion 515 so that the copper plate 540 is positioned between the center and upper core portions. The process next proceeds to a stop step 1309, wherein the process terminates.

While the foregoing method 100 is described in terms of a series of specific steps, it will be appreciated that the order of these steps may be permuted, or alternatively steps added or deleted as necessary. Many such variations are possible and are to be considered to be within the scope of the invention.

Figure 3:
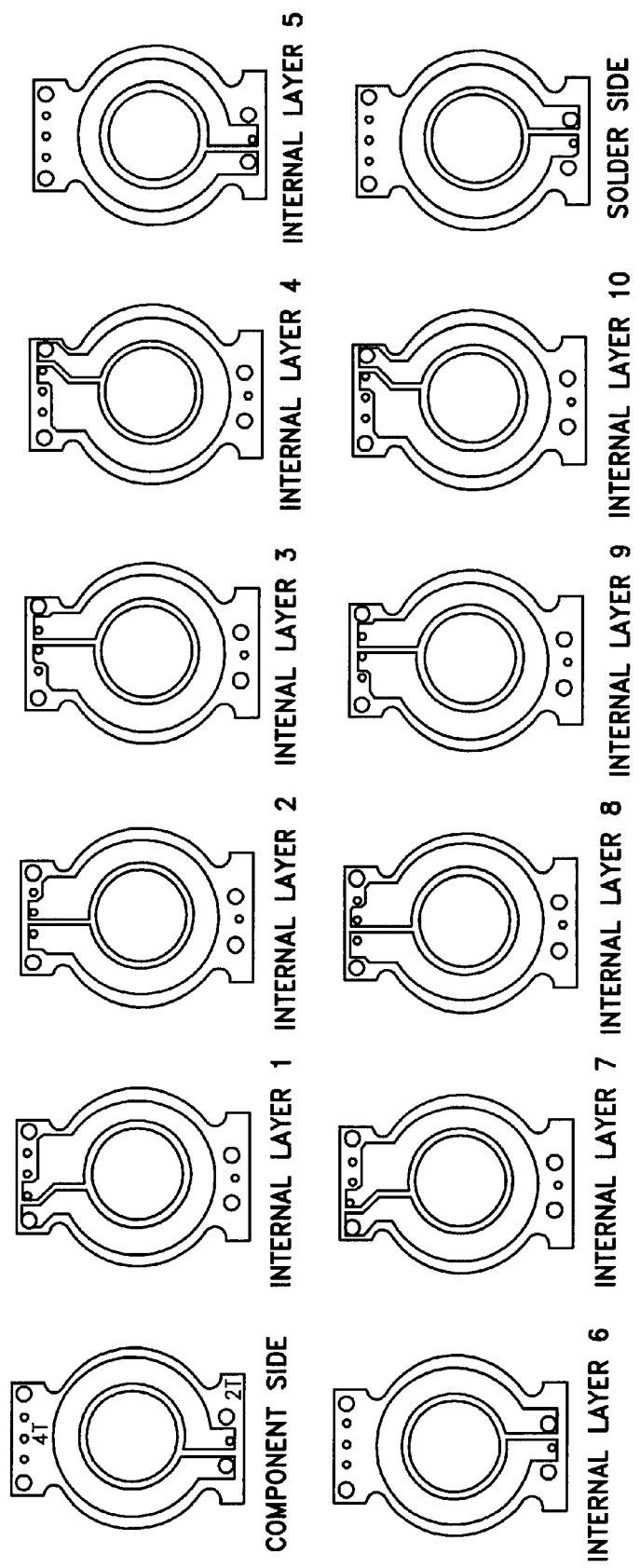
FIG. 3 is a top view of the multiple layers of the magnetic component of FIG. 1A.
Figure 4:
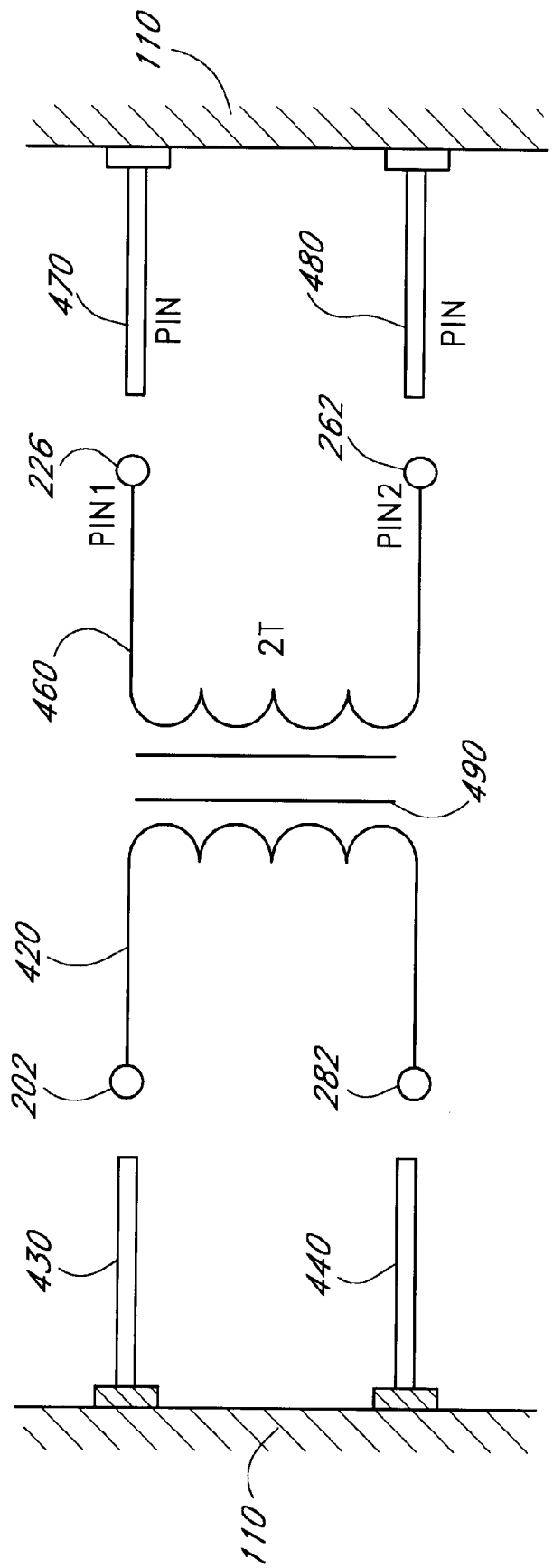
FIG. 4 is a schematic diagram of the equivalent circuit of the magnetic component of FIG. 1A.

As discussed above, the conventional planar technology included both the primary and secondary winding in a single twelve layer PCB. Moreover, the configuration of conventional windings (e.g., whether in parallel or in series) was predetermined by the particular connections used for the traces. Consequently, in order to change the turn ratios or parameters of the conventional magnetic component, a new PCB would need to be designed and manufactured. The stackable and user-configurable layout of the above embodiment overcomes this long-standing problem in the industry by providing several distinct advantages. For example, as described above, the arrangement allows a user to configure the component in such a way as to alter its turn ratios and thereby avoid the high costs of re-design and re-fabrication of a brand new component. Moreover, the offset configuration effectively eliminates the opportunity for flashover common in the current planar technology. Additionally, this arrangement replaces the traditional twelve layer board previously described by using a combination of three, four, or six layer boards, which are much easier and less costly to make than the twelve layer board. This arrangement can be accomplished using the standardized, conventional designs of FIG. 3 and as a result, several different configurations can be made without invoking the design layout process.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention.

What is claimed is:

1. An electrical device comprising:
   a plurality of printed circuit boards organized into a multi-layer configuration;
   at least a first of the plurality of printed circuit boards comprising a primary winding of a transformer;
   at least a second of the plurality of printed circuit boards comprising a secondary winding of a transformer;
   at least one conductive plate configured as an output inductor; and
   a plurality of connector pins configured to electrically connect the primary winding, the secondary winding, and the conductive plate to a main circuit board.

2. The device of claim 1, wherein each pin of the plurality of connector pins penetrates only the at least a first of the plurality of printed circuit boards comprising the primary winding or the at least a second of the plurality of printed circuit boards comprising the secondary winding.

3. The device of claim 2, wherein the at least a first of the plurality of printed circuit boards comprising the primary winding and the at least a second of the plurality of printed circuit boards comprising the secondary windings are electrically separated from each other.

4. The electrical device of claim 1, wherein the at least a first of the plurality of printed circuit boards is sandwiched between two printed circuit boards from the at least a second of the plurality of printed circuit boards.

5. The device of claim 1, further comprising a main circuit board, wherein the plurality of connector pins connect the primary winding, the secondary winding and the conductive plate to said main circuit board.

6. The device of claim 1, wherein there is one printed circuit board comprising the primary winding and two printed circuit boards comprising the secondary winding.

7. The device of claim 1, wherein each of the plurality of printed circuit boards comprises a multi-layer board.

8. The device of claim 1, wherein the conductive plate is a copper plate.

9. An electrical component comprising:
   a plurality of core members;
   a plurality of printed circuit boards configured to be stackable in a multi-layer configuration;

at least a first one of the plurality of printed circuit boards comprising a primary winding of a transformer positioned between a first core member and a second core member of the plurality of core members;

at least a second one of the plurality of printed circuit boards comprising a secondary winding of the transformer positioned between the first core member and the second core member of the plurality of core members;

at least one conductive plate positioned between said second core member and a third core member of the plurality of core pieces; and a plurality of connector pins configured to electrically connect the primary winding, the secondary winding and the conductive plate to a main circuit board, wherein each pin of said plurality of connector pins penetrates only the at least a first one of the plurality of printed circuit boards or the at least a second one of the plurality of printed circuit boards.

10. The device of claim 9, wherein the core members are fabricated from a ferrite material.

11. The electrical device of claim 9, wherein the conductive plate is a copper plate.

12. The electrical device of claim 9, wherein the conductive plate and the second and the third core members are configured as an output inductor.

13. The electrical device of claim 9, wherein the at least a first one of the plurality of printed circuit boards is sandwiched between two printed circuit boards from the at least a second one of the plurality of printed circuit boards.

14. The device of claim 13, wherein there is one printed circuit board comprising the primary winding and two printed circuit boards comprising the secondary winding.

15. The device of claim 9, wherein each of the plurality of printed circuit boards are multi-layer boards.

16. The device of claim 15, wherein each of the plurality of printed circuit boards comprises four to six layers.

17. The electrical device of claim 9, wherein the at least a first one of the plurality of printed circuit boards comprising the primary winding and the at least a second one of the plurality of printed circuit boards comprising the secondary windings are electrically separated from each other.

18. A method of manufacturing an electrical device, the method comprising:

printing at least one coil on each of a plurality of printed circuit boards;

wiring at least a first of the plurality of printed circuit boards so that the at least one coil comprises a primary winding of a transformer;

wiring at least a second of the plurality of printed circuit boards so that the at least one coil comprises a secondary winding of the transformer;

stacking the plurality of the printed circuit boards in a multi-layer arrangement;

wiring a conductive plate, wherein the conductive plate is configured as an output inductor; and connecting the plurality of printed circuit boards and the conductive plate via connecting pins to a main circuit board.

19. The method of claim 18 wherein connecting the plurality of printed circuit boards via connecting pins creates a flux that opposes a flux created by the connecting the conductive plate via connecting pins.

20. The method of claim 18, wherein in connecting the plurality of printed circuit boards, each pin of the plurality of connector pins penetrates only the at least a first of the plurality of printed circuit boards comprising the primary winding or the at least a second of the plurality of printed circuit boards comprising the secondary winding.

21. The method of claim 18, wherein the at least a first of the plurality of printed circuit boards is stacked so as not to be in physical or electrical contact with the at least a second of the plurality of printed circuit boards.

22. The method of claim 18, wherein one printed circuit board of the plurality of printed circuit boards comprises the primary winding of the transformer and two printed circuit boards of the plurality of printed circuit boards comprise the secondary winding of the transformer.

23. The method of claim 22, further comprising connecting a main switch to a power supply, wherein the main switch is configured to control power to the electrical device.

24. The method of claim 23, wherein the output inductor is configured to store energy when the main switch is in a switch "on" position and configured to provide the stored energy to a load when the main switch is in a switch "off" position.

25. The method of claim 18, wherein the conductive plate is a copper plate.

26. The method of claim 18, wherein each of the plurality of printed circuit boards are multi-layer.

27. The method of claim 26, wherein each of the plurality of printed circuit boards comprises four to six layers.

28. The method of claim 18, further comprising supplying power to the electrical device via a switch mode power supply.

29. An electrical component comprising:

a plurality of core pieces;

a plurality of printed circuit boards configured into a multi-layer configuration;

means for wiring at least a first of the plurality of printed circuit boards so as to define at least one coil which comprises a primary winding of a transformer;

means for wiring at least a second of the plurality of printed circuit boards so as to define at least one coil which comprises a secondary winding of the transformer;

means for stacking the plurality of printed circuit boards in a multi-layer arrangement;

a conductive plate, wherein the conductive plate is configured as an output inductor; and means for connecting the plurality of the printed circuit boards and the conductive plate to a main circuit board.

* * * * *